US009214224B2

(12) United States Patent
Jeon (10) Patent No.: US 9,214,224 B2
(45) Date of Patent: Dec. 15, 2015

(54) MEMORY ELEMENTS WITH SERIES VOLATILE AND NONVOLATILE SWITCHES

(71) Applicant: HEWLETT-PACKARD DEVELOPMENT COMPANY, L.P., Houston, TX (US)

(72) Inventor: Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 74 days.

(21) Appl. No.: 13/781,114

(22) Filed: Feb. 28, 2013

(65) Prior Publication Data

US 2014/0241075 A1    Aug. 28, 2014

(51) Int. Cl.
| | | |
|---|---|---|
| *G11C 11/00* | (2006.01) | |
| *G11C 13/00* | (2006.01) | |
| *G11C 14/00* | (2006.01) | |

(52) U.S. Cl.
CPC .......... *G11C 13/0004* (2013.01); *G11C 13/003* (2013.01); *G11C 13/004* (2013.01); *G11C 13/0007* (2013.01); *G11C 13/0069* (2013.01); *G11C 14/00* (2013.01); *G11C 2013/0073* (2013.01); *G11C 2213/15* (2013.01); *G11C 2213/76* (2013.01); *G11C 2213/77* (2013.01)

(58) Field of Classification Search
CPC .......... G11C 11/5678; G11C 13/0004; G11C 13/003; G11C 13/004; G11C 2013/0045; G11C 2013/0054; G11C 2213/75; G11C 2213/76; G11C 7/10; G11C 8/12; G11C 11/005; G11C 11/413; G11C 11/4076; G11C 11/4097; G11C 2207/002; G11C 2207/2227; G11C 2207/2245; G11C 7/1018; G11C 7/1045; G11C 7/22; G11C 8/00; G11C 11/4096; G11C 7/1006; G11C 7/1078; G11C 11/00; G11C 29/1201
USPC ............. 365/148, 158, 163, 171, 173, 189.01
See application file for complete search history.

(56) References Cited

U.S. PATENT DOCUMENTS 5,060,191 A * 10/1991 Nagasaki et al. ............. 365/145
(Continued)

OTHER PUBLICATIONS

Inoue, I.H. et al., Nonpolar Resistance Switching of Metal/binary-transition-metal Oxides/metal Sandwiches: Homogeneous/inhomogeneous Transition of Current Distribution (Research Paper), Feb. 26, 2007, vol. 77, No. 3.
(Continued)

Primary Examiner — Hien Nguyen
(74) Attorney, Agent, or Firm — Van Cott, Bagley, Cornwall & McCarthy (57) ABSTRACT

A memory element includes a nonvolatile switch to be set to a first low resistance state by applying a voltage higher than a positive threshold voltage and to a second high resistance state by applying another voltage more negative than a negative threshold voltage. The memory element further includes a volatile switch in series with the nonvolatile switch, the nonvolatile switch to be set to a third low resistance state by applying a current higher than a threshold current and to fourth high resistance state by applying a current lower than the threshold current. A method for operating a memory array with memory elements with series volatile and nonvolatile switches is also provided.

21 Claims, 8 Drawing Sheets

(56) References Cited

U.S. PATENT DOCUMENTS

| | | |
|---|---|---|
| 7,440,315 B2 | 10/2008 | Lung |
| 2009/0116281 A1* | 5/2009 | Parkinson et al. ............ 365/163 |
| 2010/0243983 A1 | 9/2010 | Chiang et al. |
| 2011/0317470 A1* | 12/2011 | Lu et al. ........................ 365/148 |
| 2012/0250395 A1 | 10/2012 | Nodin |
| 2013/0070511 A1* | 3/2013 | Wells et al. ................... 365/148 |

OTHER PUBLICATIONS

Peng, Hai Yang et al. "Deterministic conversion between memory and threshold resistive switching via tuning the strong electron correlation." Scientific Reports 2, Jun. 7, 2012.

* cited by examiner

| Switch | State | Region | Switching Voltage | Resistance |
|---|---|---|---|---|
| Volatile Switch | OFF | Region 1 | $-0.4 < V < 0.4$ | 10 MΩ |
| | ON | Regions 2, 3, 4, 5 | $V < -0.4$<br>$V > 0.4$ | 10 kΩ |
| Memristor (Nonvolatile Switch) | OFF | After application of $V_{off,m}$ any of regions 1, 2, 4, 5 | $V_{off,m} = -0.7$ | 1 MΩ |
| | ON | After application of $V_{on,m}$ any of regions 1, 2, 3, 4 | $V_{on,m} = 0.5$ | 100 kΩ |

$V_{th,m}^{max}/2 < V_{th,s} < V_{th,m}^{max}$ $V_{th,m}^{max}/2 < V_{th,s} < V_{read}$ $V_{th,s} < V_{read} < V_{th,m}^{max}$ $V_{th,m}^{max} < V_w < 2V_{th,s}$

$V_{th,m}^{max}/3 < V_{th,s} < V_{th,m}^{max}$ $V_{th,m}^{max}/3 < V_{th,s} < V_{read}$ $V_{th,s} < V_{read} < V_{th,m}^{max}$ $V_{th,m}^{max} < V_w < 3V_{th,s}$

Obtaining the crossbar array with memory elements, each memory element comprising a nonvolatile switch and a volatile switch in series with the nonvolatile switch, the nonvolatile switch to be set to a first resistance state by applying a first voltage higher than a positive threshold voltage and to a second resistance state by applying a second voltage more negative than a negative threshold voltage, in which a maximum threshold voltage comprises a largest value of an absolute magnitude of the negative threshold voltage and the positive threshold voltage; and the volatile switch to be set to a third low resistance state by applying a current higher than a threshold current and to fourth high resistance state by applying a current lower than the threshold current

605

---

Applying a read voltage across a memory element, in which the read voltage produces the current higher than the threshold current through volatile switch and in which the read voltage produces a voltage having an absolute magnitude smaller than the maximum threshold voltage across the nonvolatile switch.

MEMORY ELEMENTS WITH SERIES VOLATILE AND NONVOLATILE SWITCHES

BACKGROUND

Most memories in electronic devices have access transistors that connect and disconnect memory elements from the reading/writing circuits. To obtain access transistors with the desired characteristics, the access transistors and memory are typically fabricated on single crystalline silicon wafers. As the integration density of memory elements increases, the transistors also get smaller. However, as the transistor size shrinks, it becomes increasingly difficult to satisfy the switching requirements and the fabrication cost increases prohibitively. Further, the use of single crystalline silicon access devices can restrict its architecture.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Most memories in electronic devices have transistors that connect and disconnect memory elements from the reading/writing circuits. These transistors have very high ON/OFF ratios and prevent leakage currents from passing through devices that are not selected for reading or writing. Since the transistors with the required characteristics can be fabricated only by using a semiconductor with few defects, they are fabricated on single crystalline silicon wafers. This can severely limit the design flexibility and available materials in creating memories. For example, it can be very challenging to design and fabricate high density multilayer memory using single crystalline silicon wafers.

Further, the inclusion of a transistor in the memory array decreases the density of the memory. To increase the integration density of memory devices that include transistors, the transistor needs to become smaller and smaller. However, as the transistor size decreases, it becomes increasingly difficult to satisfy the requirements and the fabrication cost increases prohibitively.

The principles below describe memory elements and memory arrays that do not include transistors as switching elements to access the individual memory elements. These memory elements include a memristor-like nonvolatile switch and a current controlled volatile switch. The volatile switch is in series with the nonvolatile switch. The volatile switch has a high resistance at low voltages/currents. This effectively disconnects the memory element from the read circuitry and minimizes leakage currents. When the current exceeds the threshold current (i.e. a reading or writing voltage is applied across the memory element), the resistance of the volatile switch changes to a low resistance state. This allows most of the read or write voltage to be applied across the nonvolatile switch. The state of the nonvolatile switch can then be read or altered. For this family of memory elements, the properties of the volatile switch and nonvolatile switch can be independently engineered to meet a range of design requirements. In many cases, the properties of the volatile switch can be changed without requiring changes to the nonvolatile switch design.

The principles below describe the characteristics of these combined memory elements, interaction between the volatile switch and nonvolatile switch, parameters for adjusting the performance of memory elements, their integration into memory arrays, and the operation of these memory arrays.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1:
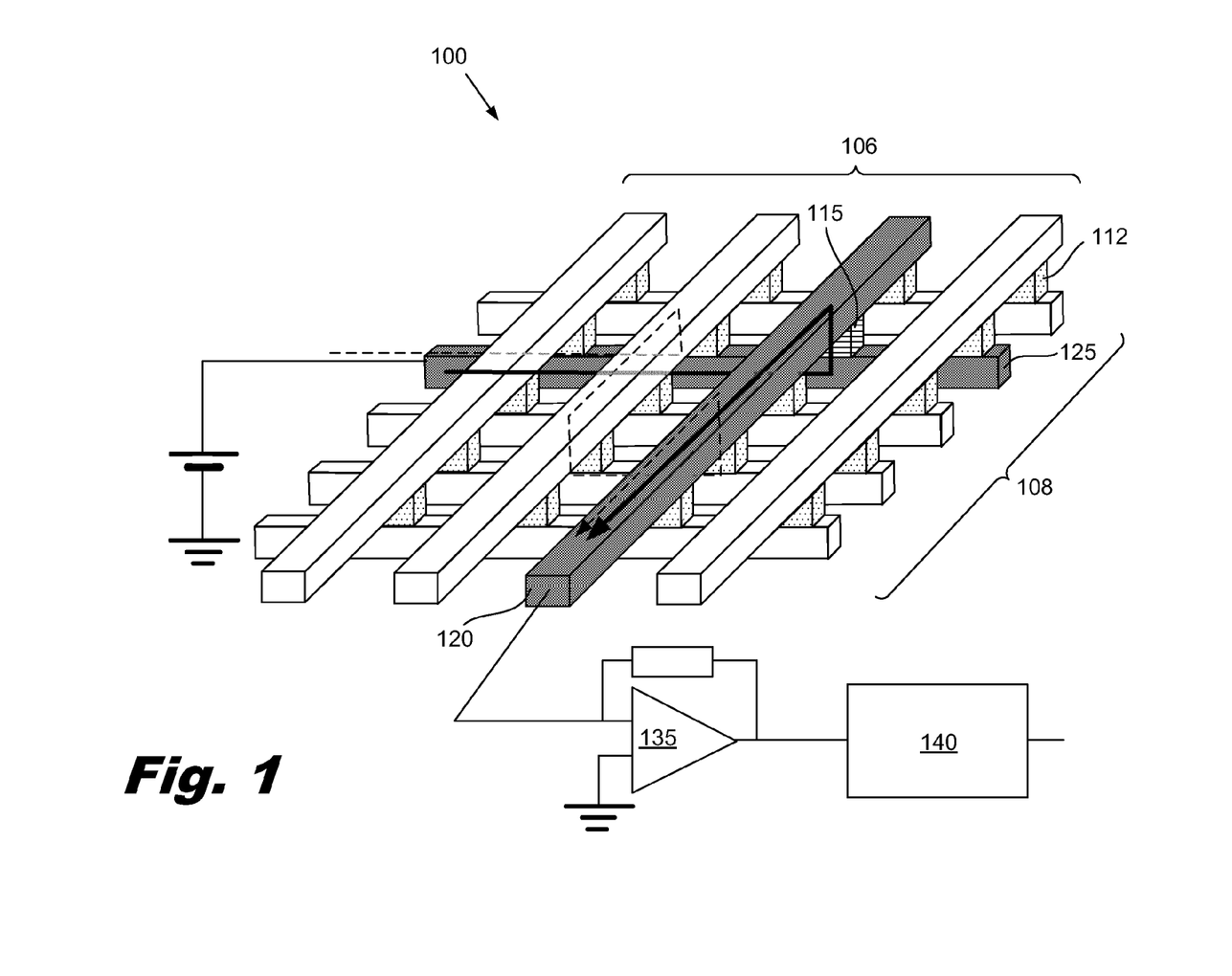
FIG. 1 is a perspective view of a crossbar array that includes combined memory elements at the intersections of the lines with each combined memory element including a nonvolatile switch and a volatile switch, according to one example of principles described herein.

FIG. 1 is a perspective view of a programmable crossbar array (100) that is populated with memory elements (112) that include a nonvolatile switch and a volatile switch. The crossbar array (100) includes a first group of conductive lines (106) called "column lines" and a second group of conductive lines (108) called "row lines." The column lines (106) cross the row lines (108) to form crossbar junctions. At the crossbar junctions, memory elements (112, 115) are formed between conductors in the first group and conductors in the second group. For example, a memory element (115) has been formed between a selected column line (120) in the first group of conductors and a selected row line (125) in the second group of conductors. For purposes of description, only a small portion of the crossbar array (100) has been illustrated. The crossbar array may include many more conductors, crossbar junctions, and memory elements. In this example, the lines are shown as a parallel and perpendicular grid. However, the crossbar array may have a variety of other configurations.

To address a given memory element (115), the row and column lines (120, 125) connected to the memory element are selected. A voltage is applied along the row and/or column lines (120, 125) to read the state of the memory element or to change the state of the memory element. For example, a voltage of V/2 could be applied to the selected row line (125) and a voltage of −V/2 could be applied to the selected column line (120). The selected memory element (115) is at the intersection between the selected row and column lines. Other memory elements that are connected to only one of the selected row (125) or column (120) lines are called "half-selected" elements. The selected memory element (115) experiences the sum of the two voltages (V/2+V/2=V). The voltage V is selected so that there is a significant difference in the current between an ON and OFF state of the memory element. Ideally, all of the current applied to the selected row/column line (120, 125) would pass through the selected element (115). In one implementation, the half selected memory elements experience a much lower voltage (V/2 or −V/2). At these lower voltages, the resistance of the half-selected memory elements is much higher and substantially lower current flows through them. However, the half-selected elements can create "sneak paths" through which current can flow from the selected row line (125) to the selected column line (120) without passing through the selected memory element. These sneak currents are not desirable and act as noise that obscures the measurement of the state of the selected memory element (115). For some architectures, and depending on the states of the memory elements involved, the voltages seen by the half-selected devices may be as high as V and currents passing through the half-selected devices may be comparable to the current passing through the selected element.

Ideally, the non-selected and half selected memory elements would have an almost infinite electrical resistance to prevent current from flowing through them until they are selected. As discussed above, the incorporation of switching transistors at each junction could provide this function but the density of the memory would decrease substantially. Further, the circuit would become much more complex and costly to manufacture.

FIG. 1 shows the measurement current as a solid line that passes along the selected row line (125), through the selected memory element (115) and down the selected column line (120) to the sense circuit (135). The sneak current, shown as dashed line, passes through a half selected memory element connected to the selected row (125), down an unselected column, through an unselected memory element, across an unselected row, and through a half selected memory element connected to the selected column (120). There are a large number of sneak paths through various half-selected and unselected memory elements. As discussed above, this sneak current represents undesirable noise in the measurement. The combination of all the currents is received by a sense amplifier (135). The output of the sense amplifier is received by a comparator module (140) that makes a determination if the selected memory element (115) is in an ON or OFF state and outputs a corresponding digital 1 or 0.

Figure 2A:
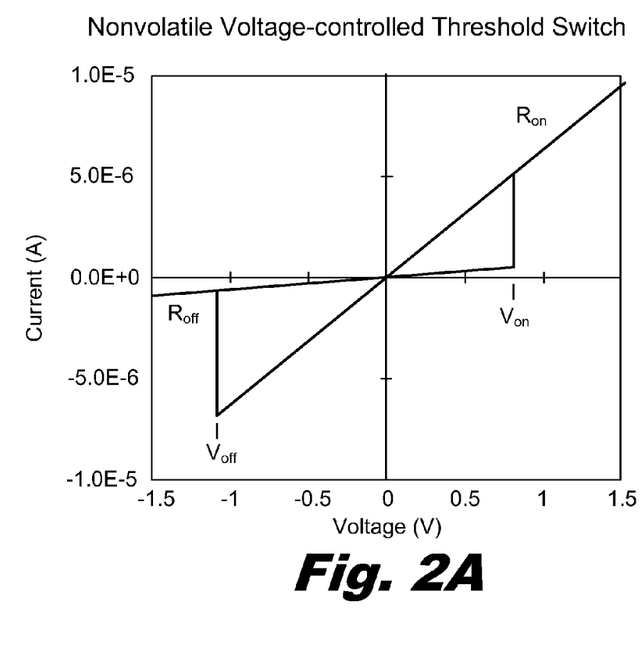
FIGS. 2A-2E include a diagram of a combined memory device and graphs showing the operational characteristics of the nonvolatile switch and the volatile switch, according to one example of principles described herein.
Figure 2B:
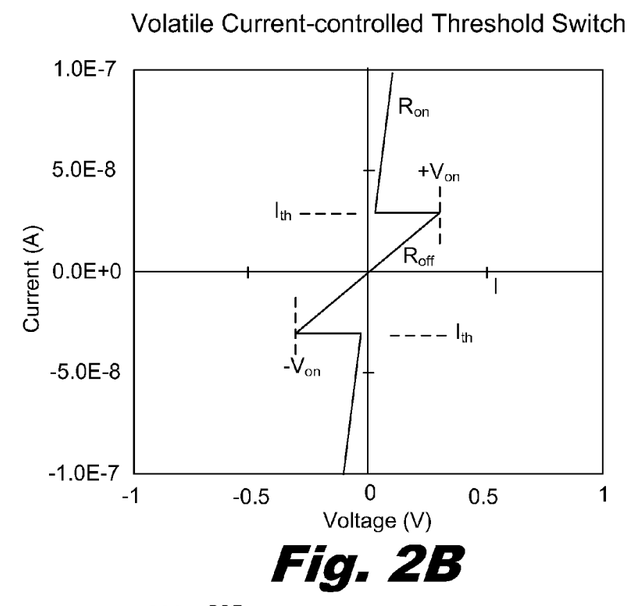
Figure 2C:
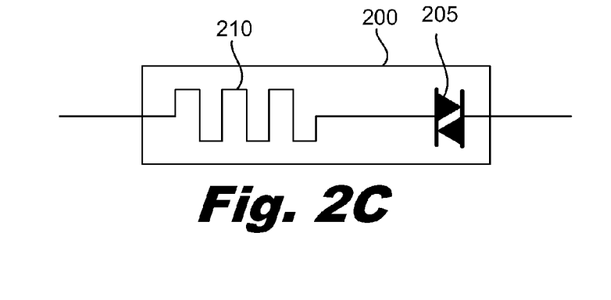

FIGS. 2A-2E describe one example of a combined memory element (200) that includes a nonvolatile voltage controlled switch (210) (represented by the memristor symbol) and volatile current controlled threshold switch (205). The symbol used to represent the volatile current controlled threshold switch is the symbol for a Diode for Alternating Current (DIAC). DIACs are only one example of a volatile current controlled threshold switch. A variety of other types of switches could be used. As shown in FIG. 2C, the combined memory element (200) includes the nonvolatile voltage controlled switch (210) in series with the volatile current controlled switch (205). The electrical characteristics of the combined memory element (200) are dependent on the characteristics of both the nonvolatile switch (210) and the volatile switch (205). For example, the resistance of the combined memory element (200) is the sum of the resistances of the nonvolatile switch (210) and the volatile switch (205). When a voltage is applied across the combined memory element (200), the voltage drop is distributed across the nonvolatile switch (210) and the volatile switch (205) according to their respective resistances at that applied voltage. The resistances of the switches (210, 205) may change as a function of applied voltage/current or the resistances may be constant within limited ranges of applied voltages/current. These current/voltage/resistance relationships are shown in FIGS. 2A, 2B, 2D, 2E. Any electrical current that passes through the combined memory element (200) passes through both the nonvolatile switch (210) and the volatile switch (205).

The left graph (FIG. 2A) shows one example of a voltage/current curve for the nonvolatile switch (210). The nonvolatile switch (210) has two states, a high resistance OFF state and a low resistance ON state. The low resistance ON state is represented by the line in the graph with a higher slope labeled $R_{on}$. The high resistance OFF state is shown as a line with a much lower slope labeled $R_{off}$. When the nonvolatile switch (210) is in the ON state, a significantly greater amount of current flows through the switch for a given voltage than the amount of current that flows through the switch (200) when the nonvolatile switch (210) is in the OFF state. This allows the state (either ON or OFF) of the nonvolatile switch (210) to be determined by the amount of current passing through the switch (200) when a given read voltage is applied. The nonvolatile switch (210) retains its state through multiple read cycles and when power is removed from the circuit.

The nonvolatile switch (210) may be any of a number of devices including memristors formed using a variety of technologies including phase change memory, resistive random access memory, transition metal oxide memristors, and other various memristor technologies.

To change the state of the nonvolatile switch (210), a write voltage is applied. The write voltage is greater than the read voltage and causes a change in the state of the nonvolatile switch (210) by altering its electrical resistance. For example, if the nonvolatile switch (210) is in a low resistance ON state and a write voltage greater than the $V_{off}$ threshold voltage is applied across the switch (210), the state of the switch (210) will change to the high resistance OFF state shown by the line labeled $R_{off}$. Once the switch (210) is switched to the OFF state, it maintains the state until a voltage higher than the $V_{on}$ threshold voltage in the opposite polarity. Similarly, a voltage greater than the $V_{on}$ threshold voltage switches the state of the nonvolatile element (210) from the OFF state to the ON state shown by the line labeled $R_{on}$ and the ON state is maintained until a voltage higher than $V_{off}$ in the opposite polarity is applied to the nonvolatile switch (210).

As shown in FIG. 2B, the volatile current controlled switch (205) operates differently from the nonvolatile switch (210). The volatile switch (205) has two states, a low resistance state $R_{on}$ and a high resistance state $R_{off}$. These states are dependent on the current that is presently flowing through the volatile switch (205). In this example, for currents between $-I_{th}$ and $+I_{th}$, the volatile current controlled switch (205) maintains an OFF state. For any current less than $-I_{th}$ or greater than $+I_{th}$, the volatile switch (205) changes to a low resistance state represented by the nearly vertical line labeled $R_{on}$. Thus at low currents the volatile switch (205) is always in a high resistance state and for high currents, the volatile switch (205) always has a low resistance state regardless of the previous history.

Figure 2D:
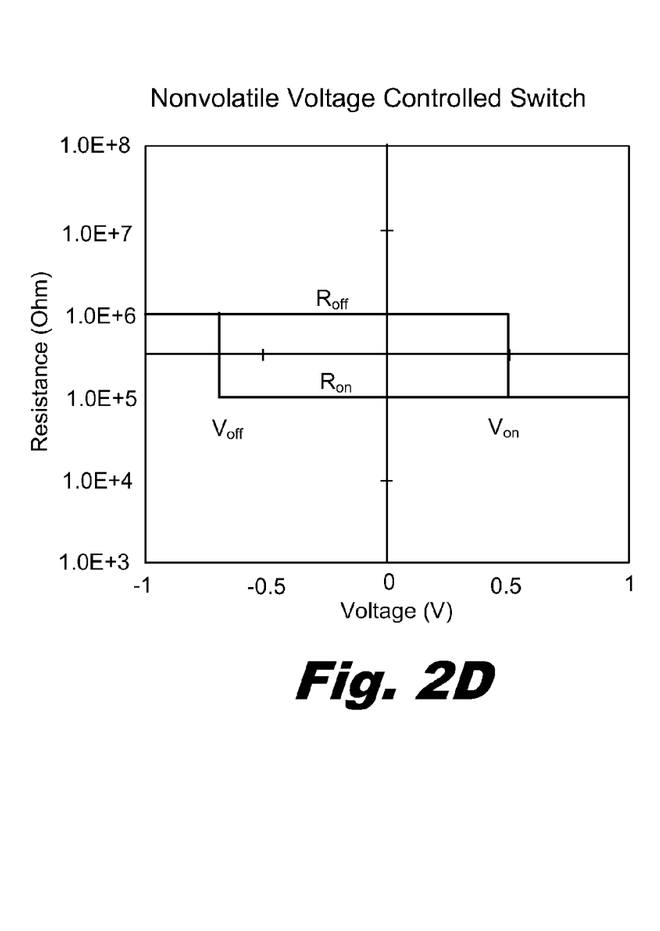

FIG. 2D shows the electrical resistance of the nonvolatile voltage controlled switch as a function of applied voltage. This graph shows that the $R_{off}$ resistance of the switch is 1.0E+6 ohms. The resistance of the switch is an order magnitude lower in the $R_{on}$ configuration. The switch transitions from the OFF state to the ON state when a voltage greater than $V_{on}$ is applied and transitions from the ON state to the OFF state when a voltage that is more negative than $V_{off}$ is applied.

Figure 2E:
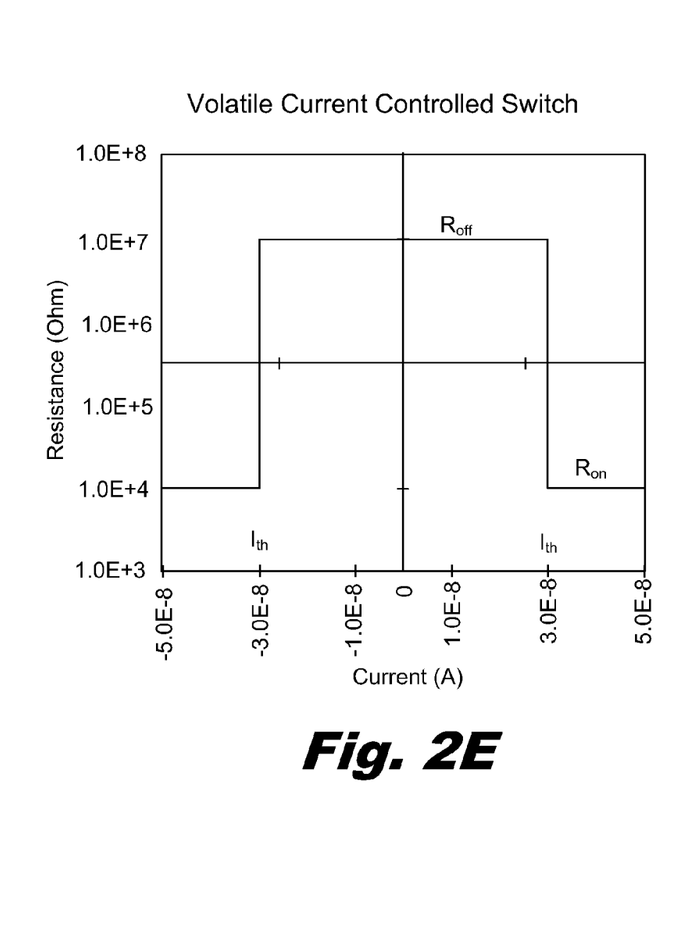

FIG. 2E shows the current/resistance relationship for the volatile current controlled switch. This graph shows that the $R_{off}$ resistance of the switch is 1.0E+7 ohms and three orders magnitude lower in the $R_{on}$ configuration. The switch transitions from the OFF state to the ON state when a current greater than $I_{th}$ is applied. When a current is reduced below the threshold current $I_{th}$, the switch transitions from the ON state to the OFF state. In this example, the current threshold $I_{th}$ is 3.0E–8 A.

As discussed above, when a voltage controlled nonvolatile switch (such as a memristor), and a current-controlled volatile switch are connected in series, the voltage is divided between two switches according to the resistance ratio between them. An applied voltage may trigger the resistance switching of each switching device. Once such a switching occurs, it will change the current through them and may also alter the voltages across each of the devices. These interactions between the voltages, the currents, and the resistances are analyzed below to understand the characteristics and operational parameters of the combined memory element.

Figure 3A:
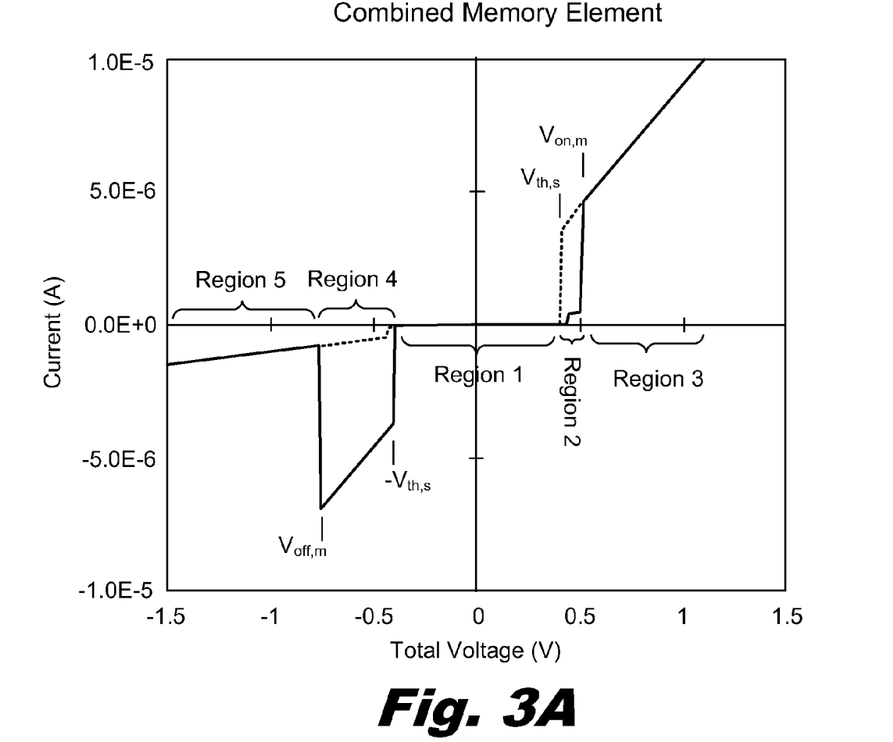
FIGS. 3A-3C are graphs and a chart that describe the operation of a combined memory element, according to one example of principles described herein.

FIG. 3A shows a graph of the electrical behavior of the combined memory element. The central portion of the graph (between about –0.4 volts and +0.4 volts) is substantially flat, indicating that for low voltages very little current passes through the combined memory element. This is because at these voltages, the volatile switch is in the OFF state. Because the OFF state of the volatile switch has an electrical resistance that is at least an order of magnitude higher than any other state of the nonvolatile switch or the ON state of the volatile switch, this resistance dominates the behavior of the memory element and blocks currents for low voltages that are typically seen by half selected and non selected memory elements in an array. This provides a number of advantages, including blocking of sneak currents that occur when the memory element is not targeted by a read or write operation but nonetheless has a small voltage applied to it.

In this example, the volatile switch turns ON at a threshold of ±0.4 volts ($V_{th,s}$=±0.4 volts), the write voltage to change the state of the nonvolatile switch to an ON state is 0.5 volts ($V_{on,m}$=0.5 volts), and the write voltage to change the state of the nonvolatile switch to an OFF state is –0.7 volts ($V_{off,m}$=–0.7 volts).

Starting at the center of the graph and moving to the right by applying increasingly greater positive voltages across the memory element, the first threshold voltage in this example is +0.4 volts. Because the volatile switch is in the OFF position and has a much higher resistance than the nonvolatile switch, the majority of this voltage drop occurs across the volatile switch. When 0.4 volts across the volatile switch is reached or slightly exceeded, the volatile switch turns ON and its electrical resistance drops to 10 kΩ. The electrical resistance of the nonvolatile switch, regardless of the state of the nonvolatile switch, now predominates and the majority of the applied voltage is across the nonvolatile switch. If the nonvolatile switch is in the OFF state, it has a resistance of about 1MΩ and if the nonvolatile switch is in the ON state, it has a resistance of 100 kΩ. Between 0.4 volts and 0.5 volts (the ON switching voltage for the nonvolatile switch) the state of the nonvolatile switch does not change and can be read by applying an intermediate voltage (a read voltage) and sensing the resulting current levels.

Starting at the center of the graph and moving to the left by applying increasingly negative voltages across the memory element, the first threshold voltage in this example is –0.4 volts where the volatile switch changes from its high resistance state to its low resistance state. Between –0.4 volts and –0.7 volts (the OFF switching voltage for the nonvolatile switch) the state of the nonvolatile switch does not change and can be read by applying an intermediate voltage (a read voltage) and sensing the resulting current levels. For voltages greater than –0.7 volts the nonvolatile switch changes to its OFF state.

The graph in FIG. 3A is divided into five regions that are defined by the switching voltages of the volatile switch ($V_{th,s}$) and the nonvolatile switch ($V_{on,m}$ and $V_{off,m}$). Region 1 is bounded by ±$V_{th,s}$, which is at ±0.4 volts. Region 1 is the protected region where the memory element conducts minimal current and does not change state. Region 2 is between +$V_{th,s}$ and $V_{on,m}$. In region 2, the volatile switch is in its low resistance ON state and the resistance behavior of the memory element is dominated by the nonvolatile switch. If the nonvolatile switch is ON (shown by the dotted line in region 2), a significant amount of current flows through the memory element (on the order of 5.0E–6 amps for this example). If the nonvolatile switch is OFF (shown by the solid line in region 2) only minimal current flows through the memory element. By applying a reading voltage between $V_{th,s}$ and $V_{on,m}$, the state of the nonvolatile switch can be read without causing it to change state. Consequently, region 2 is a readable region.

Region 3 covers voltages that are greater than $V_{on,m}$. In this region, the state of the nonvolatile switch is changed to the ON state. Consequently, voltages that are greater than $V_{on,m}$ are called writing or programming voltages and region 3 is a writeable region. Region 4 covers the voltages between –$V_{th,s}$ and $V_{off,m}$. This region is comparable to region 2 and is a readable region where the resistance characteristics of the nonvolatile switch dominate the behavior of the memory element. By applying a reading voltage less than –$V_{th,s}$ and greater than $V_{off,m}$, the state of the nonvolatile switch can be determined. Region 4 is wider than region 2 because the switching behavior of the nonvolatile switch in this example is not symmetric. The $V_{on,m}$ voltage is 0.5 volts but the $V_{off,m}$ voltage is –0.7 volts. Thus, region 4 is a readable region between –0.4 and –0.7 volts. Region 5 covers voltages that are less than $V_{off,m}$. In this region, the state of the nonvolatile switch is changed to the OFF state. Consequently, voltages that are less than $V_{off,m}$ are called programming voltages and region 5 is a writeable region.

Figure 3B:
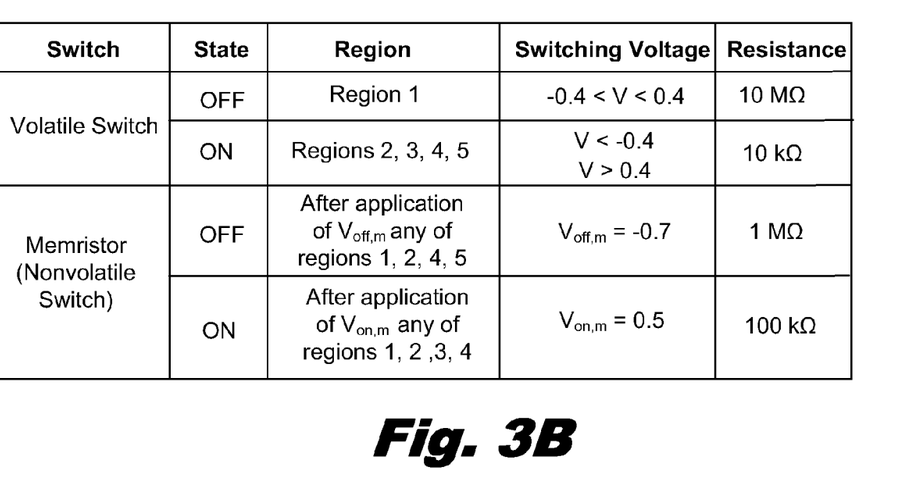

The chart in FIG. 3B shows operational parameters for one implementation of a memory element. In this example, the nonvolatile switch has an OFF resistance ($R_{off,m}$) of approximately 1 MΩ and an ON resistance ($R_{on,m}$) of approximately 100 kΩ. The volatile switch has an OFF resistance ($R_{off,s}$) of approximately 10 MΩ and an ON resistance ($R_{on,s}$) of approximately 10 kΩ. Thus when the volatile switch is in the OFF state, its resistance dominates the behavior of the memory element because its OFF resistance ($R_{off,s}$) is at least an order of magnitude greater than the OFF or ON resistance of the nonvolatile device. The ON resistance of the volatile switch is much lower. In this example, the resistance of the volatile switch is 1 MΩ for the OFF state and 100 kΩ for the ON state.

The volatile switch is OFF in region 1 which is defined by the switching voltage ($V_s$) of the volatile switch. In its OFF state, the switching voltage has a resistance of 10 MΩ. The volatile switch is in its ON state in regions 2, 3, 4, and 5. In these regions the applied voltage is greater than or less than the switching threshold $V_{th,s}$. The resistance of the volatile switch in these regions is 10 kΩ.

The nonvolatile switch has the characteristics of a memristor, meaning that it retains its state after being programmed until another programming voltage is applied. Thus, while the volatile switch responds directly to the applied voltage, the state of the nonvolatile switch changes only when a programming voltage is applied ($V_{off,m}$, $V_{on,m}$). After application of a negative programming voltage $V_{off,m}$, the nonvolatile switch remains in the OFF state in any of regions 1, 2, 4, and 5. In this example, the resistance of the nonvolatile switch in its OFF state is 1 MΩ. After application of a positive programming voltage, $V_{on,m}$, the nonvolatile switch remains in its ON state in any of regions 1, 2, 3, 4.

Figure 3C:
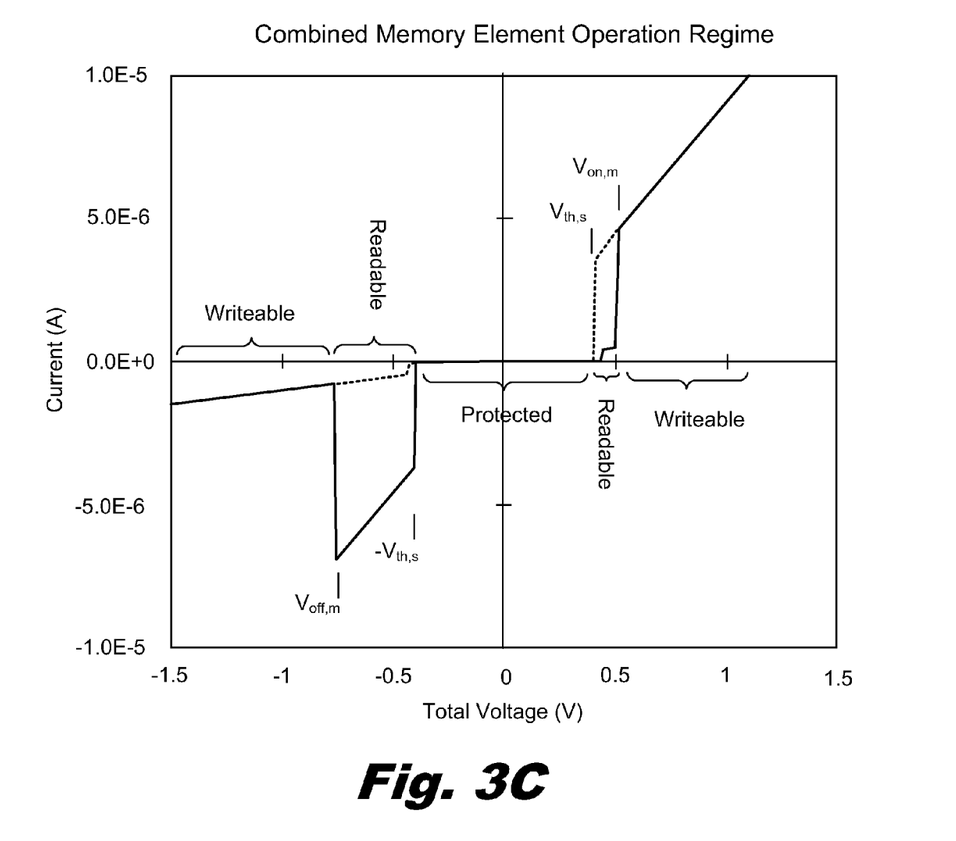

The regions are identified by their functions in FIG. 3C. To operate the memory element, it is first programmed by applying a voltage in one of the writable regions. The state of the nonvolatile switch then changes to either its OFF or ON state depending on the polarity of the write voltage. The state of the nonvolatile switch remains stable until another programming voltage is applied.

As discussed above, to read the state of the nonvolatile switch, a read voltage is applied. A read voltage can be either positive or negative. However, in this case the negative readable region is broader and consequently may be easier to use. When the memory element is not selected (i.e. the memory array is reading or programming other combined memory elements), the voltage applied across this memory element will fall within the protected region. As discussed above, the resistance of the memory element in the readable regions will be dominated by the resistance of nonvolatile switch because the volatile switch is always in its ON state in the readable regions and the ON state of the volatile switch has a resistance that is significantly lower than the resistance of the nonvolatile switch in its ON or OFF states. In the example given above, the resistance of the volatile switch in its ON state is 10 kΩ. If the nonvolatile switch is in its OFF state when a reading voltage is applied, the resistance of the memory element will be approximately 1.01 MΩ. If the nonvolatile switch is in its ON state when a reading voltage is applied the resistance of the memory element will be approximately 110 kΩ. Thus in the readable regions, the resistance contributed by the volatile switch is minimal and the majority of the voltage drop occurs across the nonvolatile switch. This allows the state of the nonvolatile switch to be unambiguously read.

In the protected region, the states of the volatile switch and the nonvolatile switch remain unchanged and minimal leakage current passes through the memory element because of its high resistance. The volatile switch is always OFF in the protected region and has a resistance of 10MΩ in this example. If the nonvolatile switch is in its OFF state, the resistance of the memory element will be approximately 11 MΩ. If the nonvolatile switch is in its ON state, the resistance of the memory element is approximately 10.1 MΩ.

Various principles that may be used to guide the selection of the various resistance and switching thresholds in the memory element are discussed below. In some examples, the desired writing voltage ($V_w$) is applied between the selected row and the selected column while all the rest of rows and columns were biased to the middle-point voltage ($V_w/2$). This ensures that maximum voltage that the unselected memory elements receive is a half of the writing voltage. To reduce leakage currents flowing through the unselected memory elements, the volatile switch should maintain a high resistance when the bias voltage is applied to the memory elements. The volatile switch should switch to a low resistance state when the full write voltage is applied.

To enable large array sizes, the resistance of the volatile switch should be higher than that of the highest resistance of the memory element at a voltage lower than the threshold voltage and lower than the lowest resistance of the memory element above the threshold voltage. Since the write voltage should be greater than the threshold voltage of the nonvolatile memory element switching ($V_{th,m}$), the threshold voltage of the volatile switch ($V_{th,s}$) should be higher than a half of the threshold voltage of the nonvolatile switch. The upper limit of the volatile switch threshold voltage is the threshold voltage of the nonvolatile switch. This relationship is shown by the following relationship: ($V_{th,m}/2 < V_{th,s} < V_{th,m}$). If the volatile switch threshold voltage is higher than the nonvolatile switch threshold voltage, the nonvolatile switch element switches as soon as the selector switches and it gives a very narrow margin for read operation.

In reading operation, the read voltage ($V_{read}$) should be high enough to switch the volatile switch into its low resistance state so that the difference in the resistance states of the nonvolatile switch may be easily determined. Therefore the read voltage should be higher than the threshold voltage of the volatile switch device. However, the read voltage should be kept below the threshold voltage of the nonvolatile switch as shown in the following relationship: ($V_{th,s} < V_{read} < V_{th,m}$). Otherwise, the state of the nonvolatile switch may be altered through the application of the read voltage. To reduce the chance that the reading operation will change the state of the nonvolatile switch, it can be desirable to use as low voltage as possible for the read operation, which is slightly above the threshold voltage of the volatile switch.

Once the nonvolatile switch threshold voltage is determined, the maximum voltage for write operation can be decided. Since a half of the write voltage is applied to some of the unselected memory elements and they should be protected by a high resistance state of the volatile switch, the write voltage should be lower than twice of the volatile switch threshold voltage. Since the write voltage should be higher than the threshold voltage of the nonvolatile switch to change the resistance states, it is the lowest allowable write voltage as shown by the following relationship: ($V_{th,m} < V_w < 2V_{th,s}$). Since the volatile switch is substantially a current-controlled device, the volatile switch threshold voltage is better described as the greatest of the voltages at the threshold current. Specific examples of these principles are given in FIGS. 4A-4C and FIGS. 5A-5C.

Figure 4A:
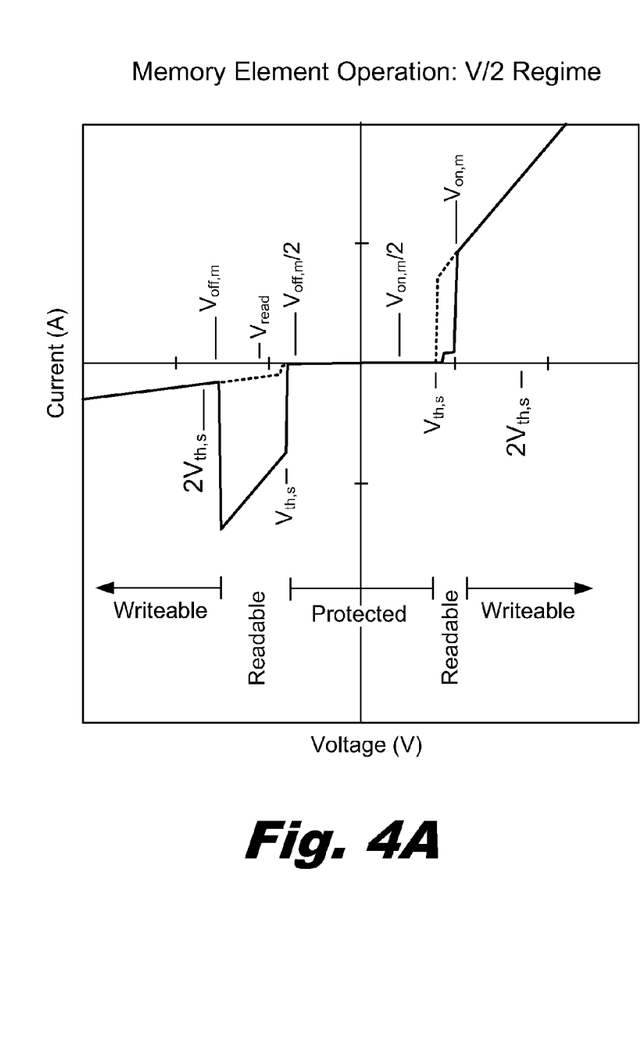
FIGS. 4A-4C are diagrams that describe the operation of a crossbar array with combined memory elements, according to one example of principles described herein.
Figure 4B:
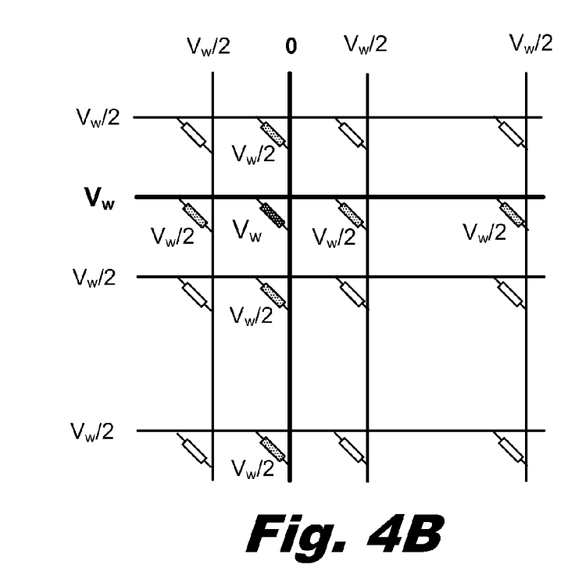
Figure 4C:
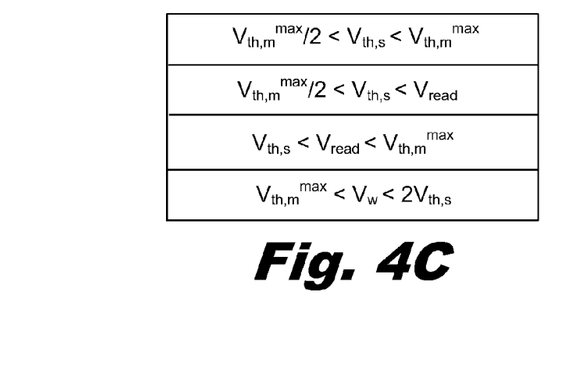

FIGS. 4A, 4B, and 4C describe the operation of a crossbar array with memory elements interposed between lines at their intersections. FIG. 4A is a graph showing the voltage current profile of the memory element and a number of operating parameters of the crossbar array. FIG. 4B is shows a small portion of a crossbar array, with horizontal lines intersecting vertical lines. A combined memory element is interposed between the lines at each intersection. In this example, a target memory element (the darkest rectangle) is targeted for programming. Selected voltages are applied to the lines. A write voltage ($V_w$) is applied to a horizontal line and a zero voltage (0) is applied to a vertical line. The target memory element is at the intersection of the line with the write voltage and the line with the zero voltage. Consequently, the entire write voltage is applied across the targeted memory element. A voltage of $V_w/2$ is applied to all other lines. This results in the half selected memory elements (devices that are connected to one of the two selected lines but not both) having a voltage of $V_w/2$ applied across them. The half selected memory elements have an intermediate shading and are labeled with $V_w/2$. Ideally, the $V_w/2$ voltage applied to the half selected memory elements falls within the protected high resistance region of the voltage current curve. All the other memory elements (nonselected devices represented by unshaded rectangles) do not see a voltage difference because both of the lines they are connected to have the same voltage ($V_w/2$). Consequently, there is no leakage current that passes through the non-selected memory elements. Ideally all of the current passes through the target memory element and changes its state. However, even though the half selected memory elements are operating in the protected region, small amounts of current will pass through the half selected memory elements because they do not have infinite resistance.

FIG. 4A shows one approach for selecting the various parameters in the system. As discussed above, the protected region is defined by the switching threshold ($V_{th,s}$) of the volatile switch. This switching threshold can be controlled by the materials and geometry used to make the volatile switch. The writable regions are defined by the voltage thresholds that turn the nonvolatile switch ON and OFF ($V_{on,m}$ and $V_{off,m}$). In some implementations, twice the threshold voltage for the volatile switch ($2V_{th,s}$) is a voltage level that is reliability within the writable regions.

The readable regions are defined by the difference between the switching threshold of the volatile switch ($V_{th,s}$) and the switching thresholds of the nonvolatile switch ($V_{on,m}$ and $V_{off,m}$). The read voltage ($V_{read}$) is selected between the switching threshold of the volatile switch ($V_{th,s}$) and the switching thresholds of the nonvolatile switch ($V_{on,m}$ and $V_{off,m}$). Variability in memory elements due to manufacturing and material differences can result in slight variations in the operational thresholds and regions described. These shifts in the operational thresholds between memory elements may make using the narrow reading region on right of the graph undesirable because a single read voltage may not reliably read all of the memory elements. However, the readable region on the left is significantly larger. Consequently, a read voltage selected in the left readable region can reliably read the state of memory elements while accommodating a significant amount of variability in those memory elements.

FIG. 4C is a chart showing the various relationships between the various parameters. This chart uses a new variable, $V_{th,m}^{max}$. As discussed above, the switching thresholds of the nonvolatile switch are not necessarily symmetrical. The ON switching voltage may be greater or smaller than the OFF switching voltage. In the example discussed above, the ON switching voltage is 0.5 volts and the OFF switching voltage is −0.7 volts. The new variable $V_{th,m}^{max}$ is the largest absolute value of the ON and OFF switching voltages. Thus for the example discussed above, $V_{th,m}^{max}$ is 0.7 volts.

The first relation defines the switching threshold voltage ($V_{th,s}$) for the volatile switch. The switching threshold for the volatile switch is greater than half of $V_{th,m}^{max}$ and smaller than $V_{th,m}^{max}$. The switching threshold voltage $V_{th,s}$ is also defined as being greater than half of $V_{th,m}^{max}$ and less than the nonvolatile switch read voltage ($V_{read}$). These parameters ensure that the switching threshold of the volatile switch is greater than the half select voltage to minimize leakage currents but less than the reading voltage. The switching threshold of the volatile switch should be less than the reading voltage so that the reading voltage primarily measures the resistance state of the nonvolatile switch.

The third relationship defines the reading voltage ($V_{read}$) as greater than the switching threshold of the volatile switch and smaller than the maximum switching voltage of the nonvolatile switch. This allows the reading voltage to be applied in the readable region where the resistance of the volatile switch is low and state of the nonvolatile switch will not be changed.

The fourth relationship defines the write voltage (Vw) for the nonvolatile switch as being greater than $V_{th,m}^{max}$ (so that the state of the nonvolatile can be changed) and less than $2V_{th,s}$ (so that the volatile switches at half-selected and non-selected crossbar junctions remain in the high resistance state).

Figure 5A:
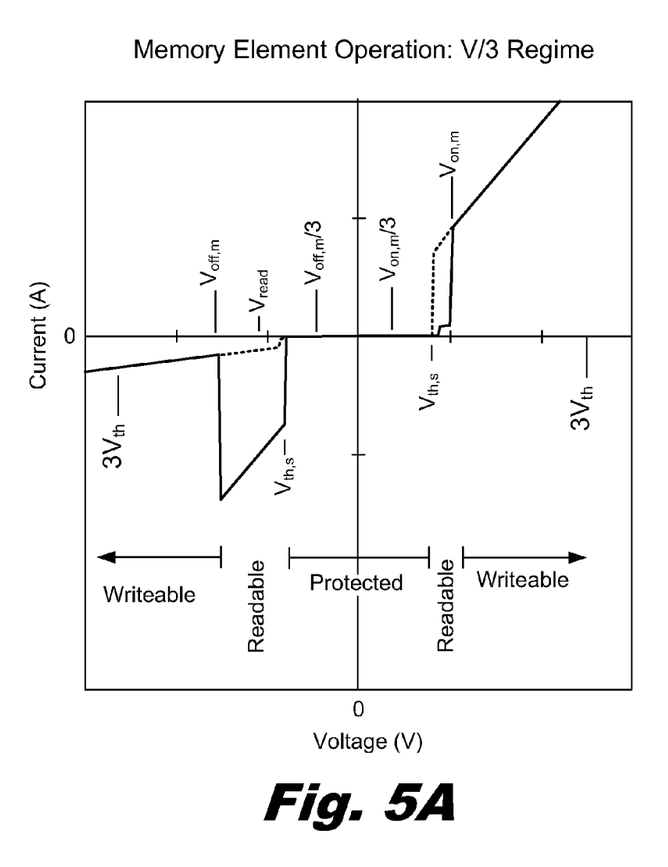
FIGS. 5A-5C are diagrams that describe the operation of a crossbar array with combined memory elements, according to one example of principles described herein.
Figure 5B:
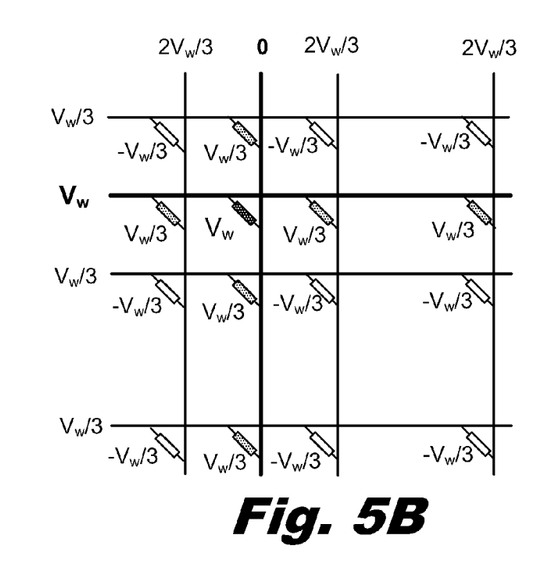
Figure 5C:
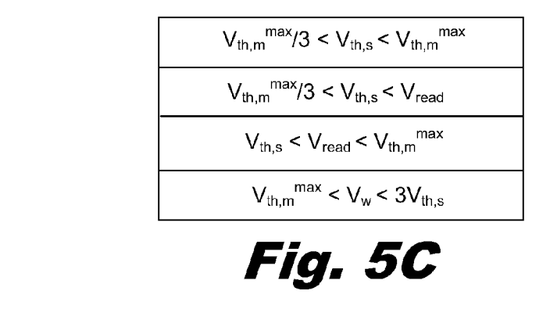

In other implementations, the unselected rows and columns are biased to one third and two third points of the write voltage. FIGS. 5A, 5B, and 5C describe the operation of a crossbar array with memory elements interposed between lines at their intersections. This operation regime is based on application of ⅓ of the write voltage across all non-selected memory elements instead of ½ the write voltage applied across the half selected memory elements. As shown in FIG. 5B, the selected row is biased to $V_w$ and the selected column to 0V, all the unselected rows are biased to $V_w/3$, and all the unselected columns to $2V_w/3$. The maximum voltage that the unselected memory elements receive is a third of the write voltage. In this case the ranges of the volatile switch threshold voltage, the read voltage, and write voltage are wider than the previously mentioned case of $V_w/2$.

FIG. 5A is a graph showing the voltage/current profile of the memory element and a number of operating parameters of the crossbar array. FIG. 5B is shows a small portion of a crossbar array, with horizontal crossbars intersecting vertical crossbars and memory elements interposed between the lines at each intersection. As discussed in FIGS. 4A-4C the target memory element (the darkest rectangle) is selected for programming. The write voltage ($V_w$) and zero voltage (0) are applied the appropriate lines, with the target memory element at the intersection of the lines. A voltage of $V_w/3$ is applied to the non-selected horizontal lines and a voltage of ⅔ $V_w$ is applied to the vertical lines. This results in a voltage of ±⅓ $V_w$ being applied across each non-selected memory element. A voltage of ⅓ $V_w$ is applied to the half selected memory elements and a voltage of −⅓ $V_w$ is applied to all the non-selected memory elements. The voltage of ±⅓ V, falls solidly within the protected high resistance region of the memory elements. Further, because each of the memory elements already has a partial voltage across them, the rise time to a read voltage is reduced. Thus, the array can be more rapidly read. However, because the non-selected memory elements experience a voltage differential, there will be some amount of leakage current through them. This can be compensated for by increasing the capacity of the voltage supplies that drive the memory array. For smaller array sizes this penalty in energy consumption and larger voltage supplies may not be significant. For larger arrays various adjustments to the scheme may be used, such as those presented in FIGS. 4A-4C.

FIG. 5A shows one approach for selecting the various parameters in the system. These parameters include the switching threshold ($V_{th,s}$) of the volatile switch, a voltage that is three times the switching threshold of the volatile switch ($3V_{th,s}$), voltage thresholds that turn the nonvolatile switch ON and OFF ($V_{on,m}$ and $V_{off,m}$), voltages that are ⅓ of the respective voltage thresholds for the nonvolatile switch ($V_{off,m}/3$ and $V_{on,m}/3$), and a read voltage ($V_{read}$) is selected between the switching threshold of the volatile switch ($V_{th,s}$) and the switching thresholds of the nonvolatile switch ($V_{on,m}$ and $V_{off,m}$).

FIG. 5C is a chart showing a number of relationships between the various parameters. This chart uses the parameter $V_{th,m}^{max}$ which is the largest absolute value of the ON and OFF switching voltages of the nonvolatile switch. The first relation defines the switching threshold voltage ($V_{th,s}$) for the volatile switch. The switching threshold for the volatile switch is greater than one third of $V_{th,m}^{max}$ and smaller than $V_{th,m}^{max}$. The switching threshold voltage $V_{th,s}$ is also defined as being greater than one third of $V_{th,m}^{max}$ and less than the read voltage ($V_{read}$). These parameters ensure that the switching threshold of the volatile switch is greater than the half select voltage to minimize leakage currents. The switching threshold of the volatile switch should be less than the reading voltage so that the reading voltage primarily measures the resistance state of the nonvolatile switch.

The third relationship defines the reading voltage ($V_{read}$) as greater than the switching threshold of the volatile switch and smaller than the maximum switching voltage of the nonvolatile switch. This allows the reading voltage to be applied in the readable region where the resistance of the volatile switch is low and state of the nonvolatile switch will not be changed. The fourth relationship defines the write voltage ($V_w$) for the nonvolatile switches as being greater than $V_{th,m}^{max}$ (so that the state of the nonvolatile switch can be changed) and less than $3V_{th,s}$ (so that the volatile switches at half-selected and nonselected crossbar junctions should remain in the high resistance state).

Given the principles described above, the memory element (200, FIG. 2C) generally includes a nonvolatile switch (210, FIG. 2C) that can be set to a first low resistance state ($R_{on}$, FIG. 2A) by applying a voltage ($+V_w$) higher than a positive threshold voltage ($V_{on,m}$) and to second high resistance state ($R_{off}$, FIG. 2B) by applying another voltage ($-V_w$) more negative than a negative threshold voltage ($V_{off,m}$). The designation voltage polarity is arbitrary as a given voltage may be characterized as either positive or negative depending on the conventions and geometry chosen.

The nonvolatile switch exhibits a maximum threshold voltage ($V_{th,m}^{max}$, FIG. 4C) that is largest value of an absolute magnitude of the negative threshold voltage ($V_{off,m}$, FIG. 4A) and an absolute magnitude of the positive threshold voltage ($V_{on,m}$, FIG. 4A). In some examples, the behavior of the nonvolatile switch is asymmetric in that the negative threshold voltage has a larger absolute magnitude than the positive threshold voltage. For these cases, $V_{th,m}^{max}$ is equal to the absolute magnitude of the negative threshold voltage.

The memory element (200, FIG. 2C) also includes a volatile switch (205, FIG. 2C) to be set to a third low resistance state ($R_{on}$, FIG. 2B) by applying a current higher than a threshold current ($I_{th}$, FIG. 2B) and to fourth high resistance state ($R_{off}$, FIG. 2B) by applying a current lower than the threshold current ($I_{th}$, FIG. 2B). A current (I) higher than the threshold current ($I_{th}$) is generated when a volatile switch voltage ($V_s$) greater than a volatile switch voltage threshold ($V_{th,s}$) is applied across the memory element, but it can be maintained higher than the threshold current with a lower voltage once the volatile switch is switched to the low resistance state.

The volatile switch voltage threshold ($V_{th,s}$) is greater than one third of the maximum threshold voltage ($V_{th,m}^{max}$, FIG. 4C) in one implementation, and greater than one half of the maximum threshold voltage ($V_{th,m}^{max}$, FIG. 4C) in another implementation. The volatile switch voltage threshold is less than the maximum threshold ($V_{th,m}^{max}$).

A read voltage ($V_{read}$) applied across the memory element places the memory element into a readable region and allows the state of the memory element to be determined. The read voltage ($V_{read}$) is greater than the volatile switch threshold ($V_{th,s}$) and less than the maximum threshold voltage ($V_{th,m}^{max}$).

A write or programming voltage ($V_w$) can be applied to the memory element to change the resistance state of the nonvolatile switch, which may be a transition metal oxide memristor. The write voltage ($V_w$) is greater than the maximum threshold voltage ($V_{th,m}^{max}$) and places the memory element in a writeable region where the volatile switch is in its low resistance state. Depending on the polarity of the write voltage, the resistance state of the nonvolatile switch may be changed to the first low resistance state or to the second high resistance state. The write voltage may be less than three times the threshold voltage of the volatile switch ($V_{th,s}$). In some implementations, the write voltage is less than two times the threshold voltage of the volatile switch.

As discussed above, the memory element has at least three different operational regions. In a protected region, the volatile switch is in the fourth high resistance state. The protected region is bounded by the volatile switch threshold ($V_{th,s}$). In a writeable region, the volatile switch is in the third low resistance state. The writable region is bounded by a negative threshold voltage ($V_{off,m}$) and positive threshold voltage ($V_{on,m}$). A readable region is bounded by the protected region and the writeable region. In the readable region, the volatile switch is in its low resistance state.

In some implementations, the second high resistance state of nonvolatile switch may be at least an order of magnitude greater than the first low resistance state and the third low resistance state of the volatile switch may be at least an order of magnitude lower than the first low resistance state. The fourth high resistance state of the volatile switch may be at least an order of magnitude higher than the second high resistance state.

As shown above, these memory elements may be incorporated into a variety of memory architectures including crossbar memory arrays such as those shown in FIG. 4B and FIG. 5B.

The principles described above related to implementations where R(off,s)>>R(off,m) and R(on,s)<<R(on,m). The benefits of the design can be achieved even when those conditions are not met. In such a case, all of the allowable voltage ranges go up. The descriptions below describe such behavior.

A parameter analysis of threshold voltage of the volatile switch ($V_{th,s}$) shows that over the range of $0<V<V_{th,m}$, that $V_{th,s}$ has no impact on the lower bound of $V_w$, but the upper bound is limited by $3V_w$. The protected range is defined by $-V_{th,s}<V<+V_{th,s}$. The readable range is defined by $V_{th,s}<V<V_{th,m}$ and $-V_{th,m}<V<-V_{th,s}$. For $V_{th,s}$ over the range of $V_{th,m}<V$, the lower bound of $V_w$ increases with $V_{th,s}$. When volatile switch turns ON, the nonvolatile switch also turns ON. This results in a narrow (or no) readable range. Consequently, $V_{th,s}$ is selected to be lower than $V_{th,m}$ to provide an adequately wide readable region.

A parameter analysis of the volatile switch OFF resistance ($R_{off,s}$) over the range of $R_{off,m}/(V_{th,m}/V_{th,s}-1)<R$ shows that there is no impact on the write voltage and no impact on the protected range. The ON/OFF ratio for the overall memory element ($R_{on}/R_{off}$) is defined by $R_{on,m}/R_{off,s}$ when $R_{off,s}$ is about the same as $R_{off,m}$. For $R_{off,s}$ over the range of ($R_{off,m} V_{th,s})/V_{on,m}<R<(R_{off,m}V_{th,s})/(V_{on,m}-V_{th,s}))$ the parameter analysis shows that as $R_{off,s}$ decreases, $V_{w,on}$ increases. The readable range widens but there is little impact for negative.

For $R_{off,s}$ over the range of $R<R_{off,m}V_{th,s}/V_{on,m}$, as $R_{off,s}$ decreases there is higher current in the protected range, $V_{w,on}$ decreases, and the volatile switch turns on at a higher voltage. However, there is no impact on $V_{w, off}$.

For $R_{on,s}$, the parameter analysis shows that for increasing values of $R_{on,s}$ that $I_{on}$ decreases and $V_{w,off}$ increases. However, variation of $R_{on,s}$ has little impact on $V_{w,on}$ or the protected range.

For $R_{on,m}$, the parameter analysis shows decreasing values of $R_{on,m}$ result in increases in $I_{on}$ and increases in the ON/OFF ratio $R_{on}/R_{off}$. $V_{w,off}$ increases as $R_{on,m}$ decreases. However, there is no impact on $V_{w,on}$ or the protected range.

For $R_{off,m}$, parameter analysis shows that as $R_{off,m}$ increases that $I_{on}$ decreases and $R_{on}/R_{off}$ increases. However, there are no other significant impacts on other parameters with variation of $R_{off,m}$.

Figure 6:
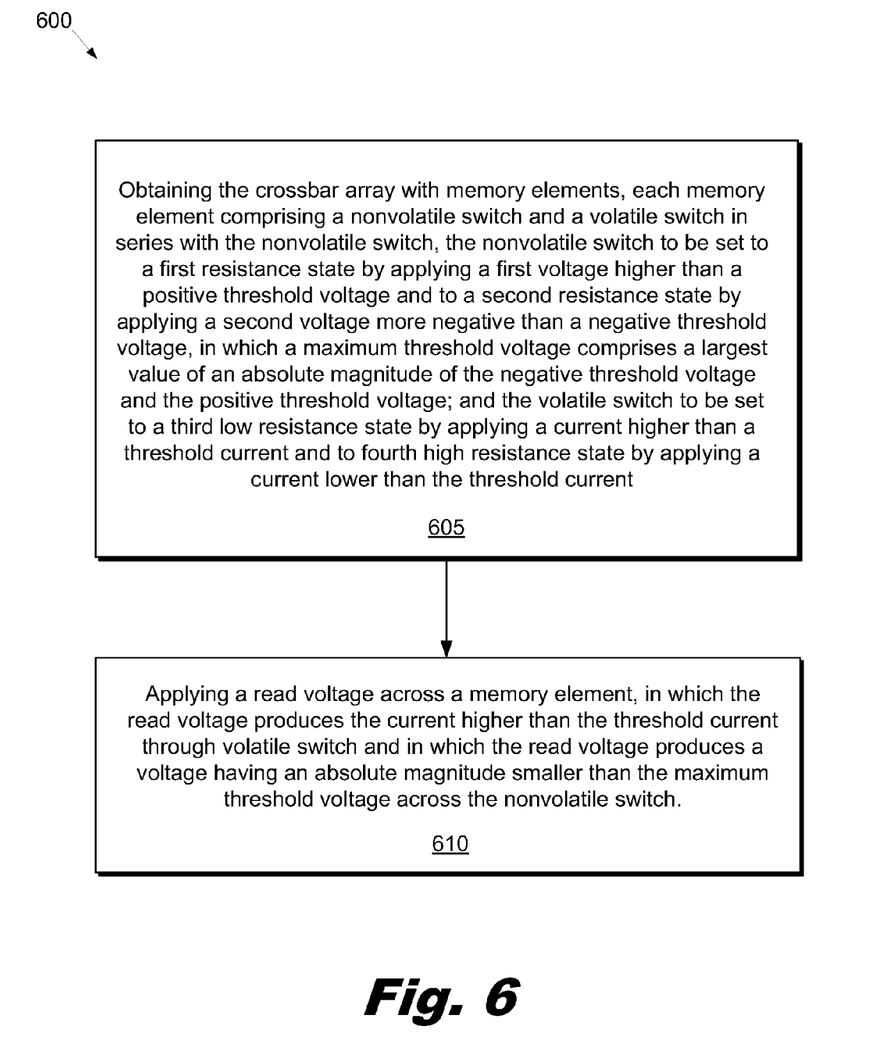
FIG. 6 is a flowchart of a method for operating a crossbar array with memory elements that includes series volatile and nonvolatile switches, according to one example of principles described herein.

FIG. 6 is one example of a method (600) for operating crossbar arrays includes obtaining a crossbar array with memory elements (605). The memory elements each include a nonvolatile switch and a volatile switch. In general, the nonvolatile switch can be set to a first resistance state by applying a first voltage higher than a positive threshold voltage and to a second resistance state by applying a second voltage more negative than a negative threshold voltage. A maximum threshold comprises a largest value of an absolute magnitude of the negative threshold voltage and an absolute magnitude of the positive threshold voltage. The volatile switch can be set to a third low resistance state by applying a current higher than a threshold current and to fourth high resistance state by applying a current lower than the threshold current.

Read voltage is applied across a memory element (610), in which the read voltage produces the current higher than the threshold current through the volatile switch and in which the read voltage produces a voltage having an absolute magnitude smaller than the maximum threshold voltage across the nonvolatile switch.

The method may also include applying a write voltage greater than the maximum threshold voltage and less than three times the volatile switch threshold voltage. The volatile switch is set to the third low resistance state by applying a voltage greater than the volatile switch threshold voltage across the volatile switch, in which the write voltage alters a resistance state of a nonvolatile switch in a target memory element.

In the description above, switches that go between two resistance states are described. However, these two resistance states represent two different ranges of resistance rather than two fixed values of resistance.

The series combination of the volatile switch and the nonvolatile switch to form a combined memory element provides a number of advantages, including: lower leakage currents, a small footprint, a high ON/OFF ratio for the memory element, lower power consumption, and a variety of other advantages. By selecting the nonvolatile switch threshold voltage according to the principle described above, the maximum margins of the operation parameters can be obtained. The principles also can be used to select a read voltage that provides stable read operation and minimize the possibility of disturbance of the state of the nonvolatile switch during the read operation. These principles also ensure that the unselected memory elements are securely protected while the selected memory element is being written. The principles define wide operating margins that enables a larger size of crossbar array without access transistors.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A memory element comprising:
    a nonvolatile switch to be set to a first resistance state by applying a voltage higher than a positive threshold voltage and to a second resistance state by applying another voltage more negative than a negative threshold voltage; and
    a volatile switch in series with the nonvolatile switch, the volatile switch to be set to a third low resistance state by applying a current higher than a threshold current and to a fourth high resistance state by applying a current lower than the threshold current,
    in which the volatile switch has a volatile switch threshold voltage which is a voltage across the volatile switch when the threshold current is flowing through the volatile switch,
    wherein the volatile switch threshold voltage is less than, but greater than one third of, a maximum threshold voltage, which is a largest value of an absolute magnitude of the negative threshold voltage and the positive threshold voltage.

2. The element of claim 1, in which the volatile switch is set to the third low resistance state by applying a voltage across the volatile switch greater than the volatile switch threshold voltage.

3. The element of claim 1, in which the volatile switch threshold voltage is greater than one half of the maximum threshold voltage.

4. The element of claim 1, in which the volatile switch comprises a diode for alternating current (DIAC).

5. The element of claim 1, in which resistance of the fourth high resistance state is substantially larger than a largest resistance of the first resistance state and the second resistance state, and resistance of the third low resistance state is substantially smaller than a smallest resistance of the first resistance state and the second resistance state.

6. The element of claim 1, in which the memory element generates:
    a protected region in which the volatile switch is in the fourth high resistance state, the protected region bounded by the volatile switch threshold voltage; and
    a writeable region in which the volatile switch is in the third low resistance state, the writable region bounded by the negative threshold voltage or the positive threshold voltage.

7. The element of claim 1, in which the memory element generates a readable region bounded by the protected region and the writeable region, in which the volatile switch is in the third low resistance state in the readable region.

8. A method for operating a crossbar array with memory elements, each memory element comprising a nonvolatile switch and a volatile switch in series with the nonvolatile switch, the nonvolatile switch to be set to a first resistance state by applying a first voltage higher than a positive threshold voltage and to a second resistance state by applying a second voltage more negative than a negative threshold voltage, in which a maximum threshold voltage comprises a largest value of an absolute magnitude of the negative threshold voltage and an absolute magnitude of the positive threshold voltage; and the volatile switch to be set to a third low resistance state by applying a current higher than a threshold current and to fourth high resistance state by applying a current lower than the threshold current in which the volatile switch has a volatile switch threshold voltage which is a voltage across the volatile switch when the threshold current is flowing through the volatile switch, wherein the volatile switch threshold voltage is less than, but greater than one third of, a maximum threshold voltage, which is a largest value of an absolute magnitude of the negative threshold voltage and the positive threshold voltage, the method comprising:
    applying a read voltage across a memory element, in which the read voltage produces the current higher than the threshold current through volatile switch and in which the read voltage produces a voltage having an absolute magnitude smaller than the maximum threshold voltage across the nonvolatile switch.

9. The method of claim 8, in which the volatile switch threshold voltage is greater than one half of the maximum threshold voltage.

10. The method of claim 8, further comprising:
applying a write voltage greater than the maximum threshold voltage and less than three times the volatile switch threshold voltage, in which the volatile switch is to set to the third low resistance state by applying a voltage greater than the volatile switch threshold voltage across the volatile switch, in which the write voltage alters a resistance state of a nonvolatile switch in a target memory element.

11. The method of claim 10, in which the write voltage is less than twice the volatile switch threshold voltage.

12. The method of claim 11, in which the volatile switch threshold voltage is greater than one half of the maximum threshold voltage.

13. The method of claim 10, further comprising:
applying a first bias voltage with a magnitude of one third of the write voltage to a portion of the non-selected crossbars; and
applying a second bias voltage of two thirds of the write voltage to a second portion of the non-selected crossbars;
such that a voltage with an absolute magnitude of one third of the write voltage is applied across each memory element in the crossbar array except for the target memory element.

14. The method of claim 9, further comprising:
applying a third bias voltage with a magnitude of one half of the write voltage to the non-selected crossbars;
such that a voltage with an absolute magnitude of at most one half of the write voltage is applied across each memory element in the crossbar array except for the target memory element.

15. A method for operating a crossbar array with memory elements, each memory element comprising a nonvolatile switch and a volatile switch in series with the nonvolatile switch, the nonvolatile switch to be set to a first resistance state by applying a first voltage higher than a positive threshold voltage and to a second resistance state by applying a second voltage more negative than a negative threshold voltage, in which a maximum threshold voltage comprises a largest value of an absolute magnitude of the negative threshold voltage and the positive threshold voltage; and the volatile switch to be set to a third low resistance state by applying a current higher than a threshold current and to a fourth high resistance state by applying a current lower than the threshold current in which the volatile switch has a volatile switch threshold voltage which is a voltage across the volatile switch when the threshold current is flowing through the volatile switch, wherein the volatile switch threshold voltage is less than, but greater than one third of, a maximum threshold voltage, which is a largest value of an absolute magnitude of the negative threshold voltage and the positive threshold, the method comprising:
applying a write voltage greater than the maximum threshold voltage, in which the volatile switch is to set to the third low resistance state by applying a voltage greater than the volatile switch threshold voltage across the volatile switch, in which the write voltage alters a resistance state of a nonvolatile switch in a target memory element.

16. The method of claim 15, further comprising applying a read voltage across the memory element, in which the read voltage is greater than the volatile switch threshold voltage.

17. The method of claim 16, in which the read voltage is less than the maximum threshold voltage.

18. The method of claim 15, in which the write voltage is less than twice the volatile switch threshold voltage.

19. The method of claim 18, in which the volatile switch threshold voltage is greater than one half of the maximum threshold voltage.

20. The method of claim 18, in which the write voltage is within a writable region bounded by the negative threshold voltage or the positive threshold voltage.

21. The method of claim 15, in which the write voltage is less than three times the volatile switch threshold voltage.

* * * * *